United States Patent
America et al.

(10) Patent No.: US 6,300,160 B1
(45) Date of Patent: Oct. 9, 2001

(54) PROCESS FOR CHARGE COUPLED IMAGE SENSOR WITH U-SHAPED GATES

(75) Inventors: William G. America, Hilton; David L. Losee, Fairport, both of NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/443,271

(22) Filed: Nov. 18, 1999

(51) Int. Cl.⁷ .................................................. H01L 21/339
(52) U.S. Cl. ......................................... 438/75; 438/147
(58) Field of Search .............................. 438/60, 75, 76, 438/78, 144, 146, 147, 666

(56) References Cited

U.S. PATENT DOCUMENTS

| | | | |
|---|---|---|---|
| 5,240,873 | * 8/1993 | Shinji | 438/144 |
| 5,773,324 | * 6/1998 | Yoon et al. | 438/146 |
| 5,891,752 | 4/1999 | Losee | 438/75 |

* cited by examiner

Primary Examiner—Chandra Chaudhari
(74) Attorney, Agent, or Firm—Peyton C. Watkins

(57) ABSTRACT

A method and apparatus of forming adjacent, non-overlapping CCD electrodes within an image sensing device such the electrodes are U-shaped. The device provided by the disclosed method employs a substrate with a gate dielectric layer formed on a surface of the substrate with a plurality of phases created within the CCD. A deposited silicon layer is placed on the surface of the CCD and a mask is used to cover areas other than the first set of electrodes. Etching takes places leaving the mask areas to the deposited silicon and a set of side walls to the remaining deposited silicon are then oxidized. A first set of electrodes by forming an electrode layer placed over the CCD. CMP is employed to remove remaining deposited silicon layer as well as portions of the electrode layer such that the side walls remain vertical portions to electrode layer remaining in the side walls. The process is then repeated by placing another electrode material layer and another CMP process leaving two sets of adjacent U-shaped gates.

9 Claims, 12 Drawing Sheets

PROCESS FOR CHARGE COUPLED IMAGE SENSOR WITH U-SHAPED GATES

CROSS-REFERENCE TO RELATED APPLICATIONS

The present application is related to U.S. application Ser. No.09/443,011 filed concurrently herewith, entitled "Charge Coupled Image Sensor With U-Shaped Gates" by David L. Losee, et al.

FIELD OF THE INVENTION

The present invention relates to the formation of electrodes within charge coupled devices, and more particularly, to the formation of non-overlapping electrodes within charge coupled devices.

BACKGROUND OF THE INVENTION

Solid state image sensors are very commonly based charge coupled device (CCD) technology, and are generally classified into either interline transfer type or frame transfer type. The CCD image sensing device is typically an array of closely spaced gates composed of polycrystalline silicon (polysilicon). Polysilicon has been a material of choice due to the ease with which a reliable thin insulating layer may be produced to insulate the separate gates from one another. In operation of frame transfer type imagers, incident light must pass through the gate electrodes and be absorbed by the underlying silicon. Thus, it is desired that these gates be transparent to a broad spectrum of wavelengths of light, and in particular to be transparent to shorter wavelengths, for example, shorter than 450 nm wavelength. Polysilicon gates are not suitable for high transmission in this wavelength range. Hence, devices utilizing more transparent conducting materials, typically composed of conducting oxide materials such as indium-tin-oxide (ITO), have been proposed. For purposes of this disclosure, the term ITO is to be understood to include other conducting materials, as well.

In the prior art as taught by Losee, in U.S. Pat. No. 5,891,752, a method for constructing a CCD image sensor with all ITO gates is proposed. In that device, however, the ITO gates are subjected to chemical mechanical polishing (CMP) to achieve the required electrical isolation between adjacent gates. This CMP process can be non-uniform over widely spaced regions and, hence, devices so produced have some variation in ITO thickness from one area of the device to another. Due to the relatively high index of refraction of the ITO material, this thickness variation results in variation in the relative amount of light which reaches the silicon substrate, and hence, produces a spatial variation in the relative sensitivity of the device. For improved optical response, it is desirable to employ relatively thin ITO for the gates, for example, using thicknesses less than 100 nm. With decreasing ITO gate thickness, the variation in thickness caused by the CMP process causes stronger variation in the relative sensitivity of the device.

Another concern with the polished structure, particularly when thin ITO gates are desired, is due to fixed electrostatic charges which inevitably occur in overlying insulating layers of the device. Such fixed charge will cause small potential variations, usually as regions of increased electrostatic potential, immediately below the insulating gap between the CCD electrodes. This is illustrated in FIG. 1a. In this figure, electrostatic potential contours are indicated, and if seen that a potential well, or pocket, appears in the region beneath the electrode gap. The depth of this well depends on both the gate electrode separation and the placement and magnitude of the fixed insulator charge. Such a potential well can introduce charge transfer inefficiency, an undesirable property, in the operation of the CCD shift register.

From the foregoing it should be apparent that there remains a need in the art for a method of producing a more uniform gate thickness in frame transfer CCD images sensors, this is especially true when the gates are composed of ITO. It should also be apparent that there remains a problem of reducing the effect of fixed charges which may be present in overlaying insulating layers. Such fixed charges can result in undesirable potential wells or barriers in the underlying silicon substrate, which, in turn, can lead to charge transfer inefficiency. These and other problems within the prior art are addressed by the present invention.

SUMMARY OF THE INVENTION

The present invention addresses the problem of producing a more uniform gate thickness in frame transfer CCD images sensors with all gates composed of ITO. It also addresses the problem of reducing the effect of fixed charges which may be present in overlaying insulating layers. Such fixed charges can result in undesirable potential wells or barriers in the underlying silicon substrate, which, in turn, can lead to charge transfer inefficiency. A device and method of manufacture are disclosed wherein the gate electrodes are of a substantially U-shaped geometry, which effectively shields the charge transfer channel from the effects of the fixed charge and wherein the gate electrode material, for example, ITO, is of improved optical uniformity.

The present invention discloses a CCD based image sensing device with non-overlapping gates wherein the gates have a vertical conducting section at their edges. With such vertical edge sections present, the deleterious effects of the fixed insulator charges in the upper layers of the CCD are electrostatically shielded, such shielding resulting in a reduced channel potential well between the gates. Such a shielding effect is shown in the calculated potential profile of the CCD channel in FIG. 1a and FIG. 1b. In FIG. 1a, the gate electrode thickness is thinner than the space between the electrodes. For purposes of this illustration, the voltages on the two gates in the figure are equal. It is seen that a potential non-uniformity exists in the gap between the gate electrodes. This is indicated by the presence of the oval shaped contour in the center of the figure. In FIG. 1b, the gate electrodes are provided with vertical edge regions which act to partially shield the substrate from the effect of the fixed charge and the potential well is reduced. Comparing FIG. 1b with FIG. 1a, the gate electrode thickness remains the same as in FIG. 1a, and thus the optical characteristics are substantially the same for the two devices. The general form of the gate structure, in cross-section, with such vertical edges is thus U-shaped. In FIG. 1c, a more extended cross-sectional diagram of a CCD structure is shown.

ADVANTAGES OF THE PRESENT INVENTION

The present invention has the advantage that a CMP process does not touch the horizontal surfaces of ITO gates (polysilicon) which in turn eliminates non-uniformity in the gate that typically results from the CMP process. The present invention provides vertical sections between the individual gates which act as an electrostatic shield resulting in only small potential wells occurring between the gates. This also simplifies the polishing process. These advantages are obtained without requiring any additional steps.

DETAILED DESCRIPTION OF THE INVENTION

Figure 1A:
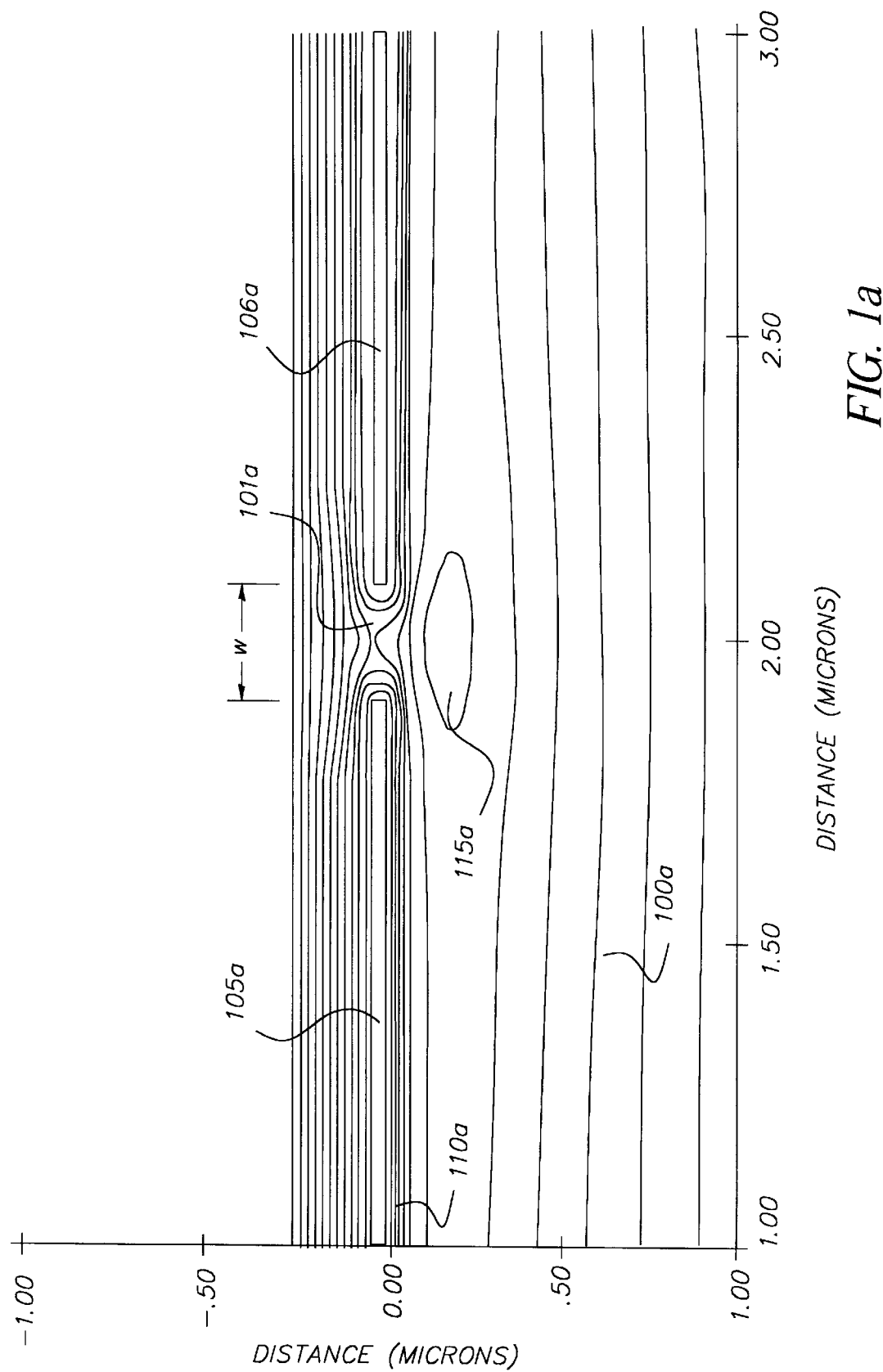
FIG. 1a is a potential contour map for a prior art device with thin gate electrodes illustrating the gap between electrode gates and the resulting.

FIG. 1a shows equipotential contours calculated from the electrostatic modeling of a region of a CCD device wherein gate electrodes, 105a and 106a are non-overlapping and are separated from each other by a gap, 101a, the gap, of width w, being greater than the thickness, t, of the gate electrodes. The gate electrodes are separated from the semiconductor substrate, 100a, by a gate dielectric, 110a. The semiconductor substrate, 100a, is provided with doping to produce a buried channel CCD device as is well understood by those skilled in the art. It is seen that the gap, 101a, produces a region of increased potential, 115a, in the substrate. The magnitude of the potential non-uniformity is dependent on the gap width as well as any fixed charge which might be present in the layers above the gap. The presence of such potential non-uniformities is deleterious to the efficient transfer of charge in the CCD and, therefore, should be minimized.

Figure 1B:
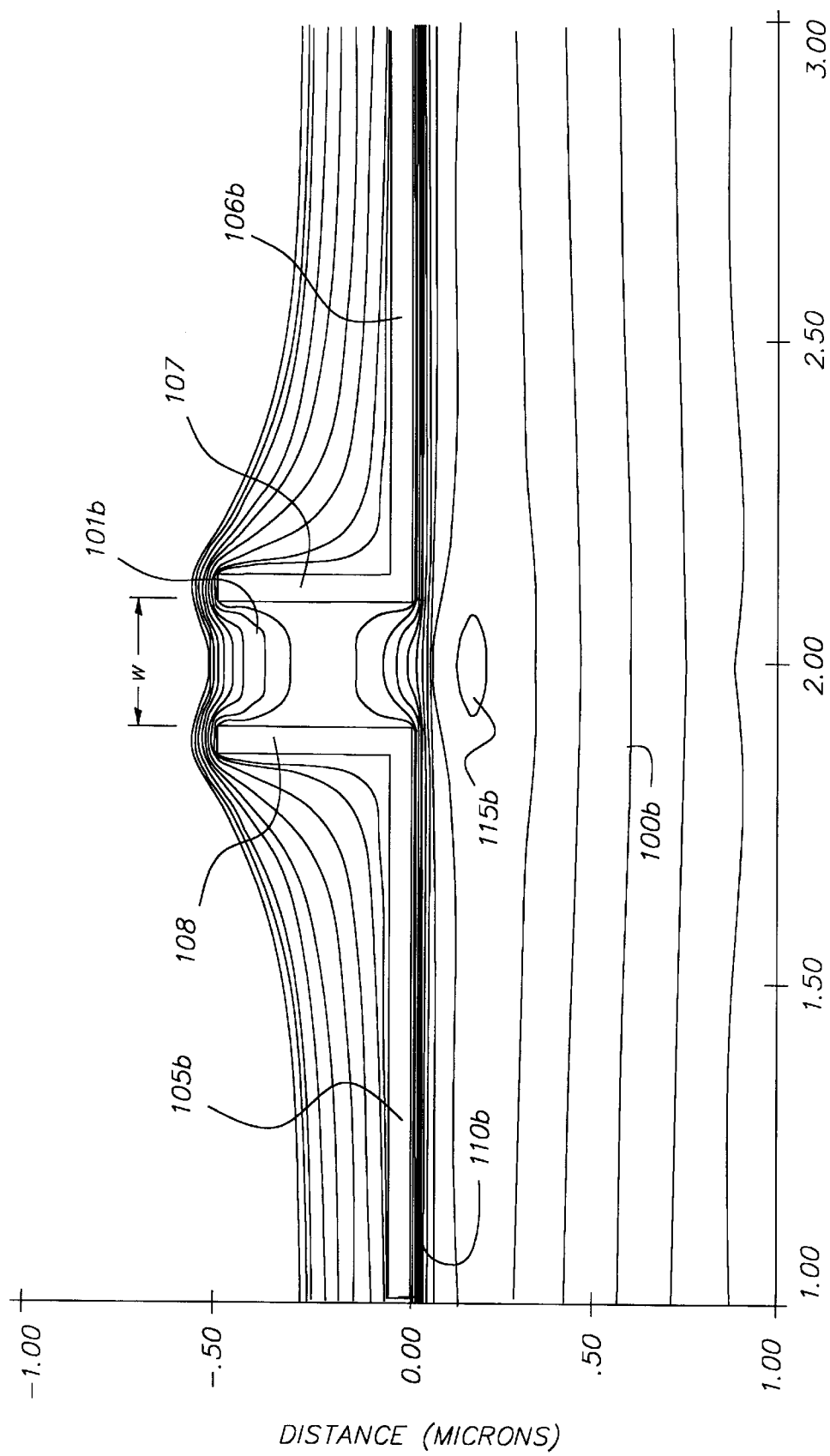
FIG. 1b is a potential contours with vertical extensions on gates.

In FIG. 1b, the gate electrodes, 105b and 106b, are separated from semiconductor 100b by dielectric 110b and the gate electrodes, 105b and 106b, are separated by gap, 101b, of width w, with the additional feature that the edges of the electrodes are extended vertically to include vertical electrode segments, 107 and 108. Again, equipotential contours are calculated by electrostatic modeling. In this case, by contrast with FIG. 1a, it is seen that the potential non-uniformity, 115b, in the region below the gap is reduced. This is due to the shielding effect of the vertical segments, 107 and 108.

Figure 1C:
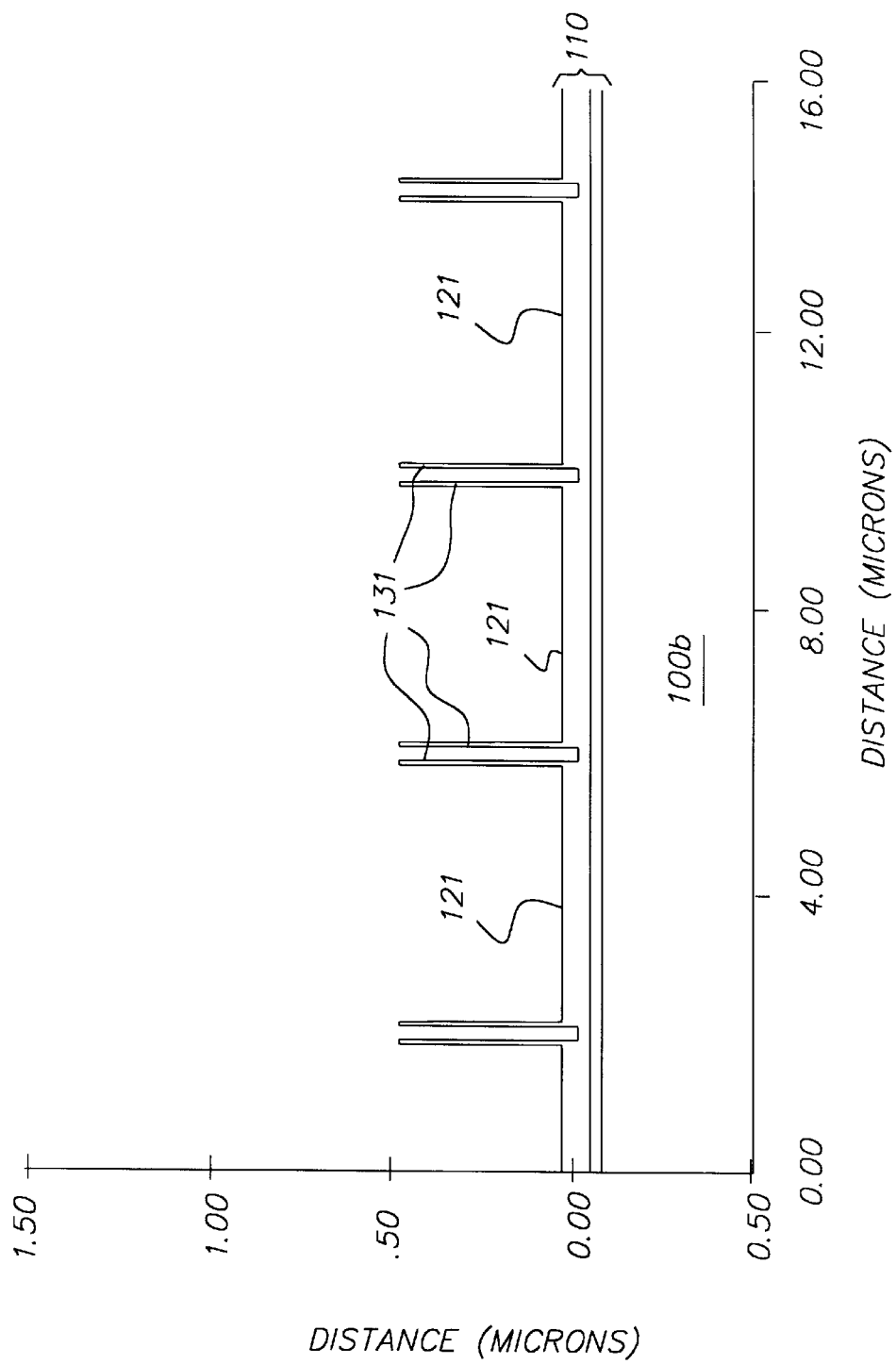
FIG. 1c is a completed CCD structure where gates are non-overlapping and have vertical conductive sections at gate edges (U-shaped structure)

FIG. 1c shows, schematically, a cross-section of a portion of a CCD shift register wherein each gate consists of horizontal sections 121 and vertical edge sections 131. As is well known, the semiconductor substrate for such an array of such gates may be provided with dopants and the gates are connected to clocking voltages to effect the charge transfer.

It has been discovered that a CCD based image sensing device with non-overlapping gates can be provided wherein the gates have a vertical conducting section at their edges. The vertical edge sections prevent the deleterious effects of the fixed insulator charges in the upper layers of the CCD which are electrostatically shielded. The shielding results in a reduced channel potential well between the gates. Such a shielding effect is shown in the calculated potential profile of the CCD channel in FIG. 1a and FIG. 1b. In FIG. 1a, the gate electrode thickness is thinner than the space between the electrodes. For purposes of this illustration, the voltages on the two gates in the figure are equal. It is seen that a potential non-uniformity exists in the gap between the gate electrodes. This is indicated by the presence of the oval shaped contour in the center of the figure. In FIG. 1b, the gate electrodes are provided with vertical edge regions which act to partially shield the substrate from the effect of the fixed charge and the potential well is reduced. Comparing FIG. 1b with FIG. 1a, the gate electrode thickness remains the same as in FIG. 1a, and thus the optical characteristics are substantially the same for the two devices. The general form of the gate structure, in cross-section, with such vertical edges is thus U-shaped. In FIG. 1c, a more extended cross-sectional diagram of a CCD structure is shown.

Figure 2A:
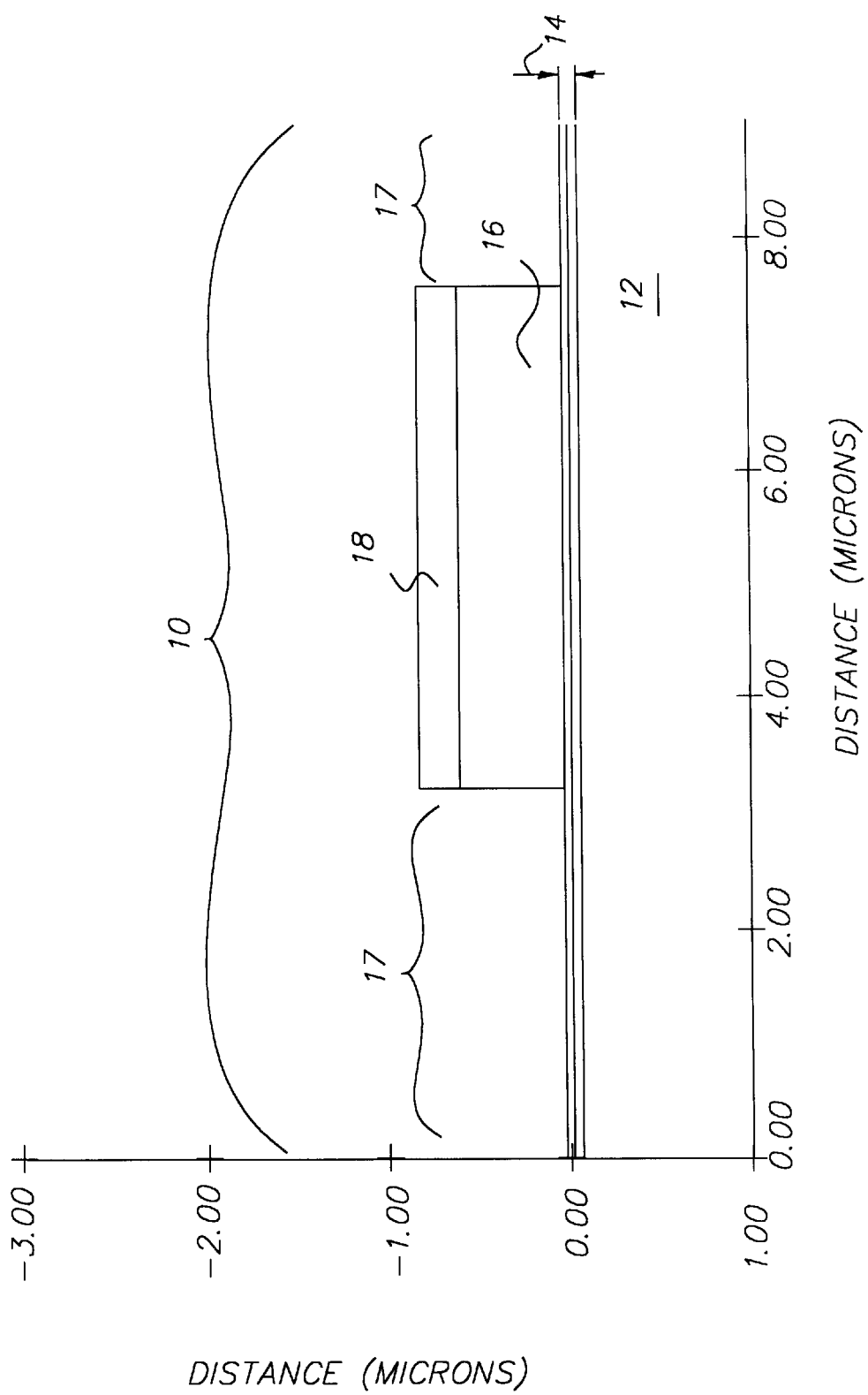
FIGS. 2a–2i is a process flow and simulation chart outlining a method of fabrication of a CCD with such U-shaped gates.

Referring to FIGS. 2a–2i, the method of fabrication of a charge coupled device (CCD) having U-shaped electrode gates is outlined. Referring now to FIG. 2a, a silicon substrate 12 is covered with a dielectric layer 14. The gate dielectric layer 14 is a bilayer stack of silicon oxide and silicon nitride in the preferred embodiment. However, it will be readily apparent to those skilled in the art, that other materials can also be used for the dielectric layer 14. Still referring to FIG. 2a, a plurality of phases within the CCD 10 are formed by depositing a silicon layer 16 on the surface of the CCD 10 and forming a Chemical Mechanical Polishing (CMP) polish stop layer 18 on the deposited silicon layer 16. The CMP polish stop layer 18 is preferably a nitride material. Both the deposited silicon layer 16 and the CMP polish stop layer 18 are then photolithographically etched to open the areas 17 within the phases where electrodes are to be formed.

Figure 2B:
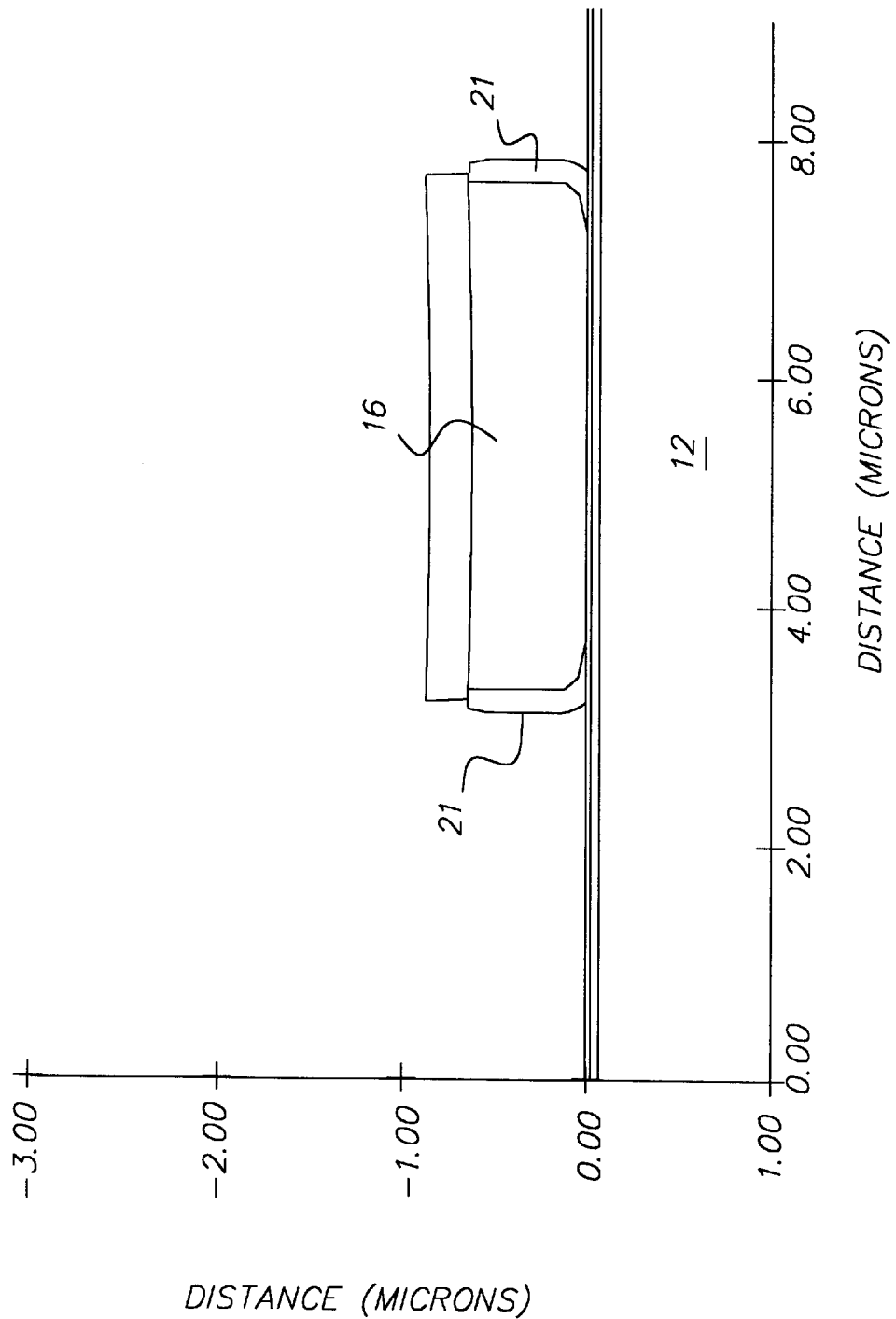
Figure 2C:
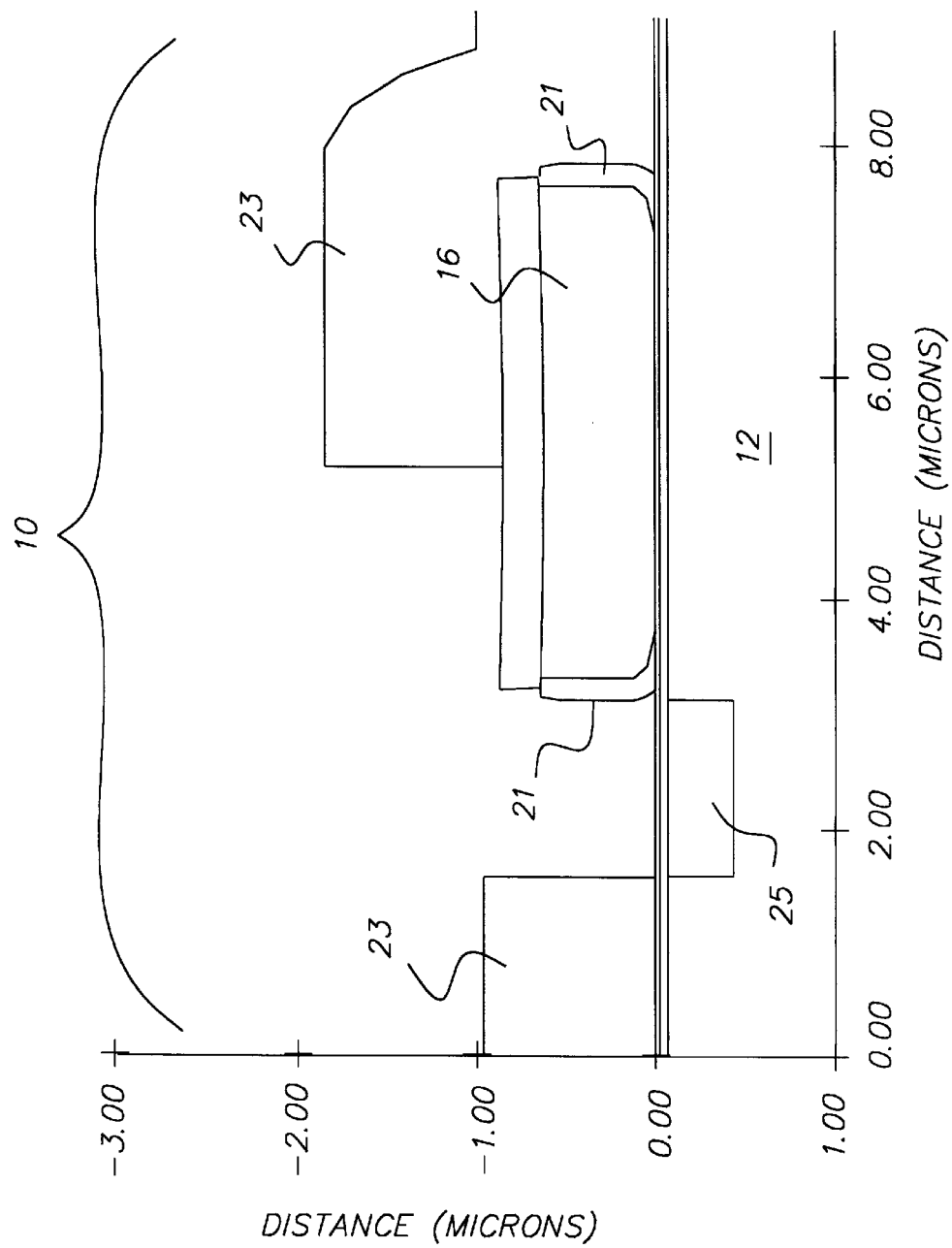

Referring to FIG. 2b, the photolithographically etched deposited silicon layer 16 areas are then oxidized to create side walls 21 on the remaining areas of the deposited silicon layer 16. The preferred embodiment of the present invention envisions a two-phase charge coupled device. In order to facilitate the charge transfer within a two-phase charge transfer device, barrier implants are necessary to control the direction of charge transfer. Thus, referring to FIG. 2c, photoresist 23 is formed on the CCD 10 as such that the areas where barrier implants 25 are desired are exposed. In the present invention a boron implant is envisioned, but other types of implants are specifically envisioned also, both p-type and n-type. After the implants 25 are formed, the photoresist 23 is stripped and the CCD is annealed.

Figure 2D:
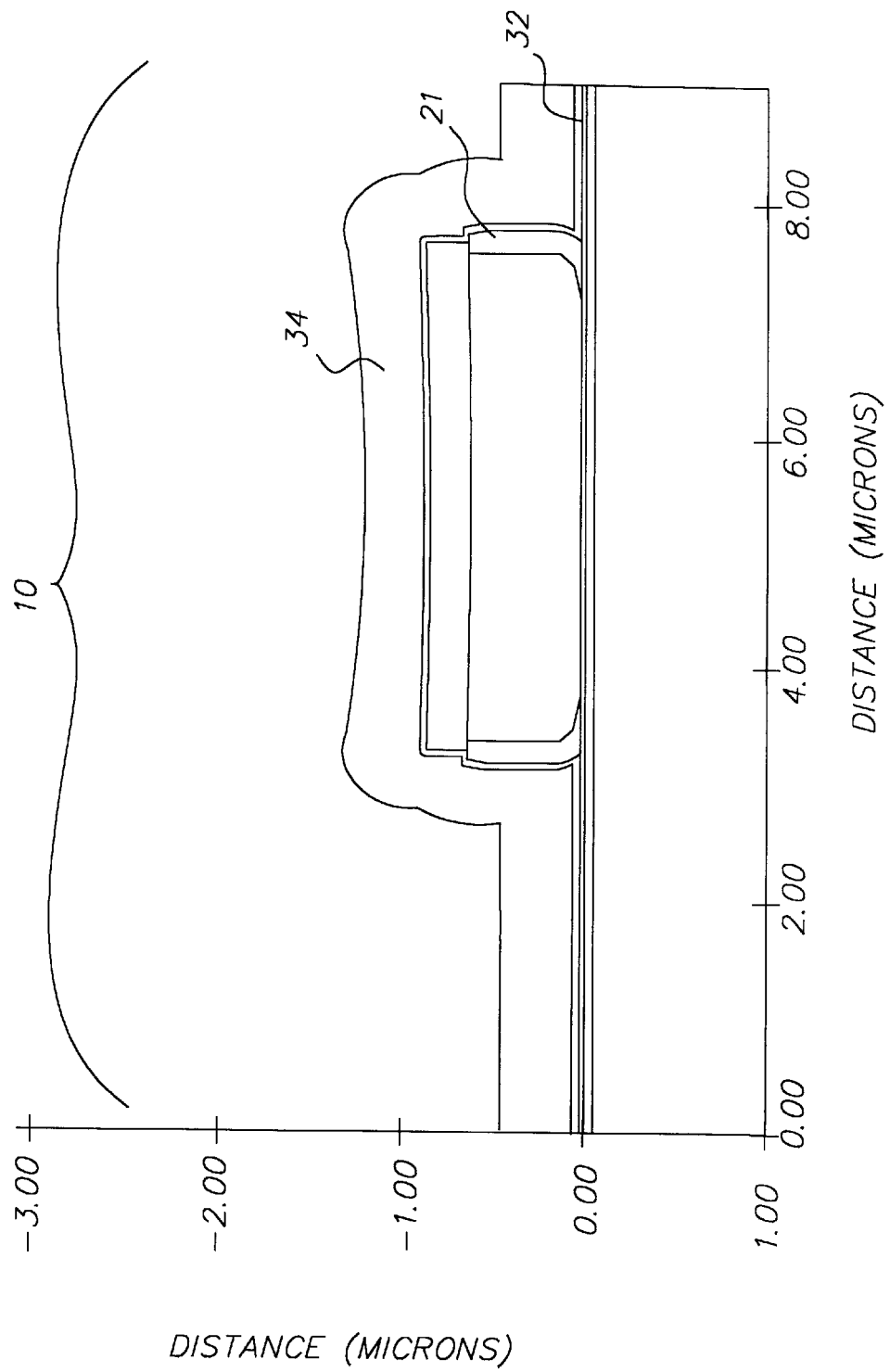

Referring now to FIG. 2d, a gate electrode material 32 is deposited over the CCD 10. Here, the gate electrode material 32 is formed over the oxidized side walls 21 such that the formed gate electrode layer 32 has both horizontal and vertical components. A polish buffer layer 34 is then placed over the gate electrode material 32. A low temperature oxide (LTO) is preferred as the polish buffer layer 34. In the preferred embodiment ITO is used as gate electrode material 32 because of its transparency, especially in the blue wavelengths. Also, it is specifically envisioned the polysilicon can be used as the gate electrode material 32. Also, materials can be used that selectively result in specific transparency bandwidths.

Figure 2E:
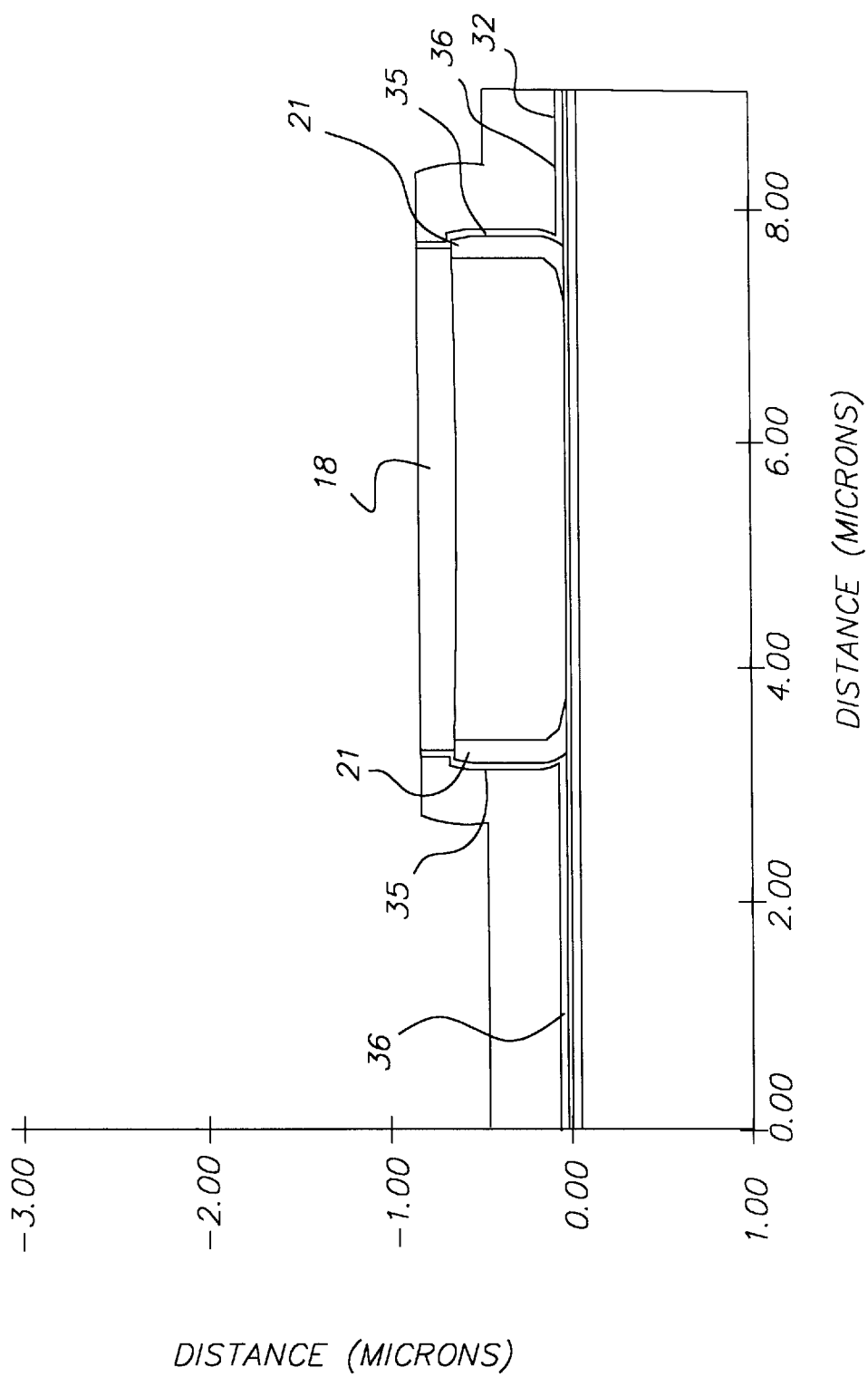

Referring to FIG. 2e, the polish buffer layer 34 is removed via chemical mechanical polishing down through the gate electrode material 32 to the CMP polish stop layer 18. This leaves a vertical component layer 35 of gate electrode material 32 on the oxidized side walls 21 in a vertical direction as well as a horizontal component layer 36 to the gate electrode material 32.

Figure 2F:
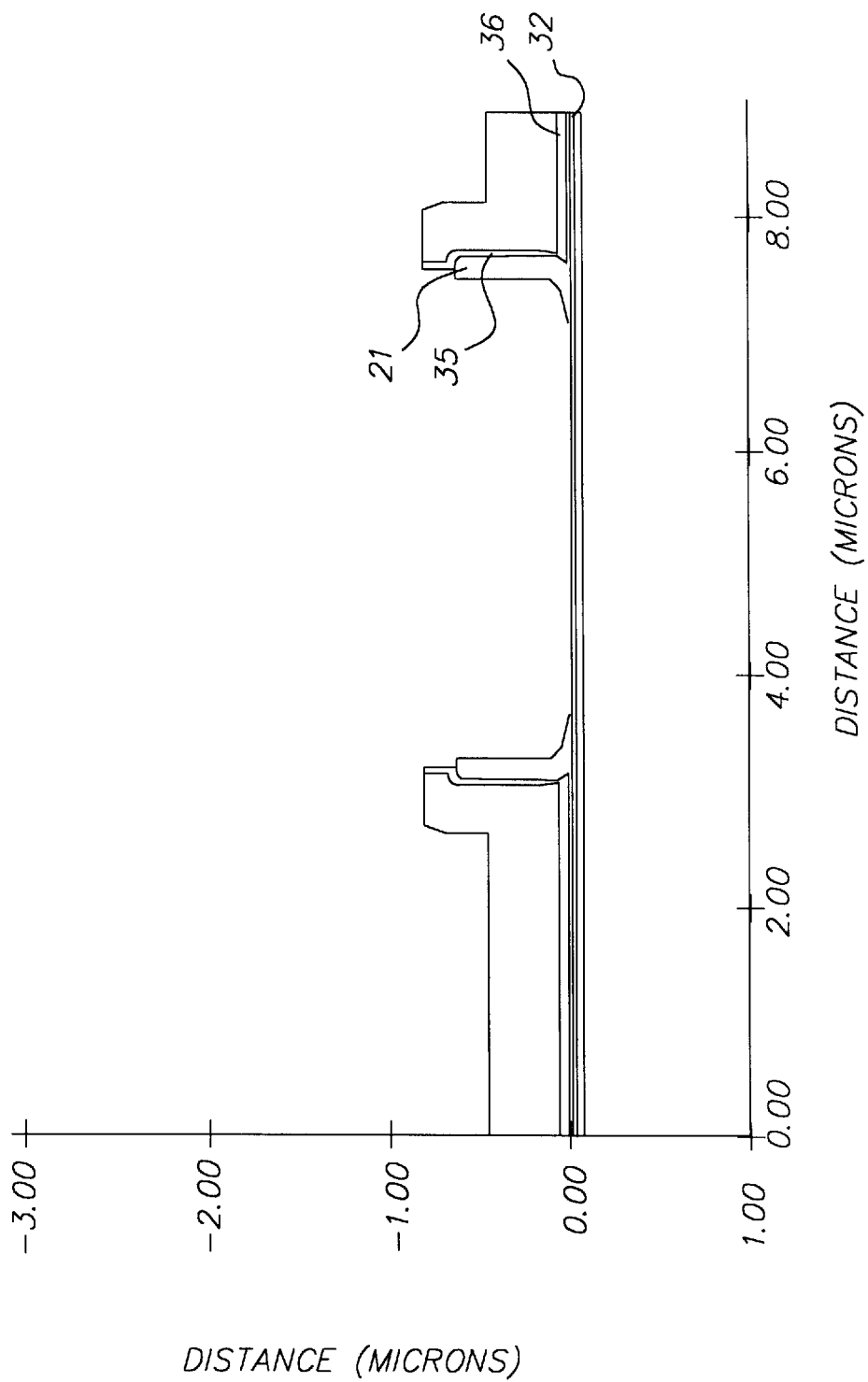

Referring to FIG. 2f, the material used to form the CMP polish stop layer 18 is removed along with the unoxidized portion of the deposited silicon layer 16 This removal is typically accomplished by subjecting the structure to an etchant, either a plasma etch or a liquid chemical etch, which will remove the polish stop material but will not significantly attack other exposed materials. This polish stop removal is followed by a second etch of the then exposed silicon layer 16, where the silicon etchant does not substantially attack the remaining exposed materials. Appropriate etchants may be selected as are well known to those experienced in the art. For example, for a polish stop layer composed of silicon nitride, a fluorine containing plasma etch may be used to effectively remove the nitride but leaving the oxide and ITO layers intact. This is then followed by a chlorine containing plasma etch which removes the exposed silicon but leaves the ITO and the oxide intact.

Figure 2G:
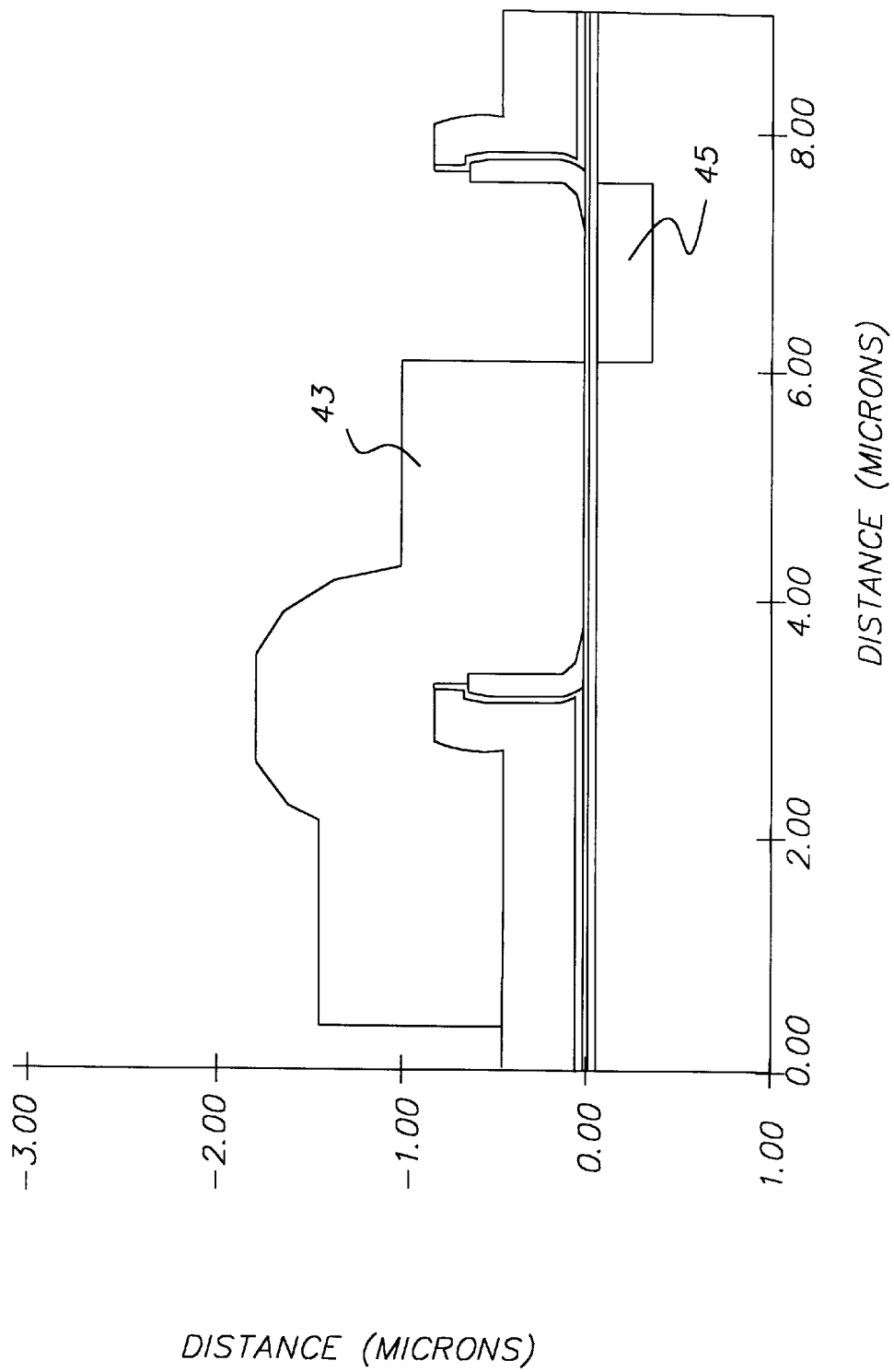
Figure 2H:
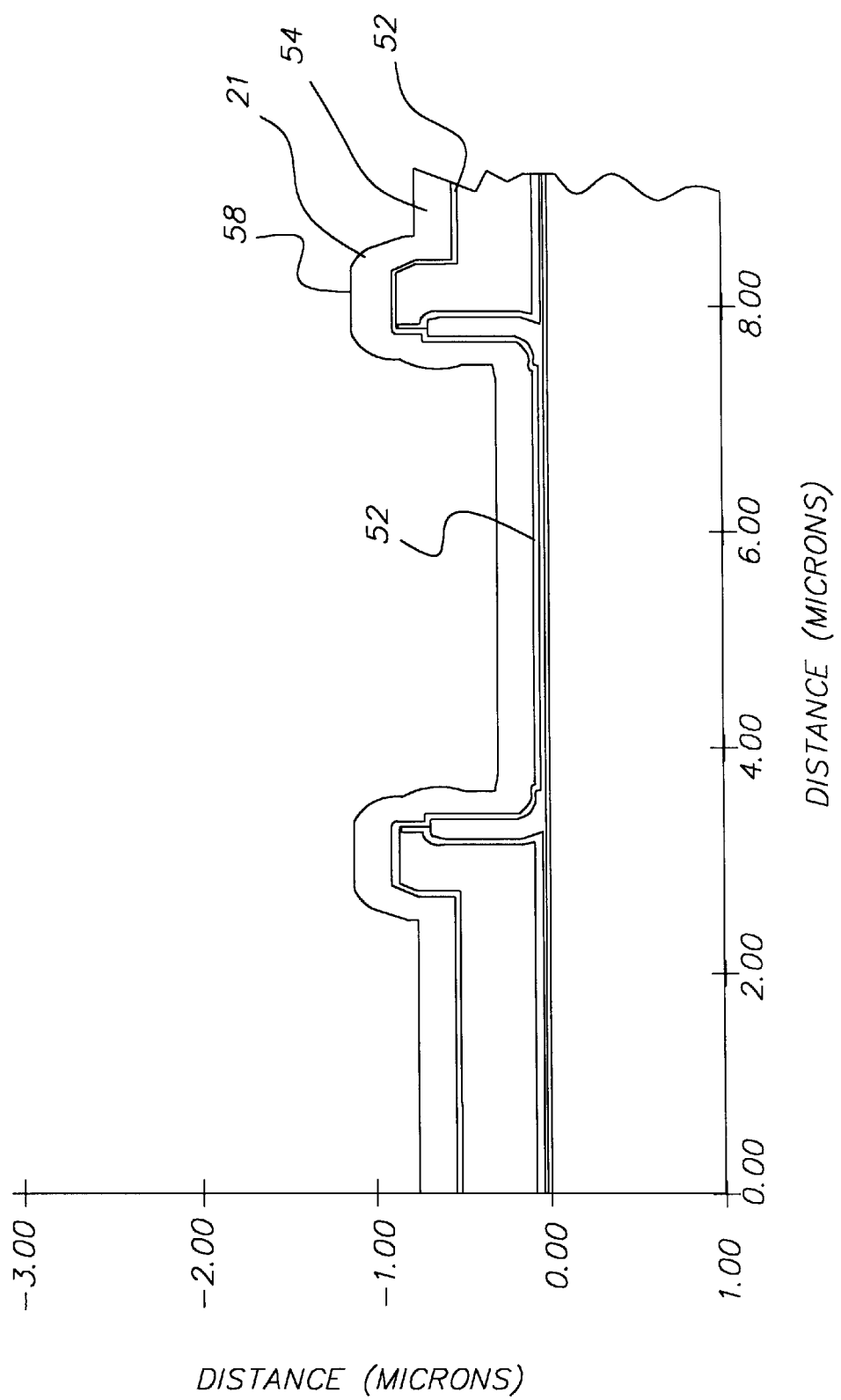

FIG. 2g illustrates the process of creating the next set of phases to CCD 10 by placement of a photoresist layer 43 to provide a mask for another barrier implant 45. The photoresist layer 43 is then stripped and referring to FIG. 2h, a second gate electrode material 52 is applied to the CCD 10. Another polish buffer layer 54 which again is a low temperature oxide (LTO) is then placed on the CCD 10 which creates a set of protrusions 58 over side wall 21.

Figure 2I:
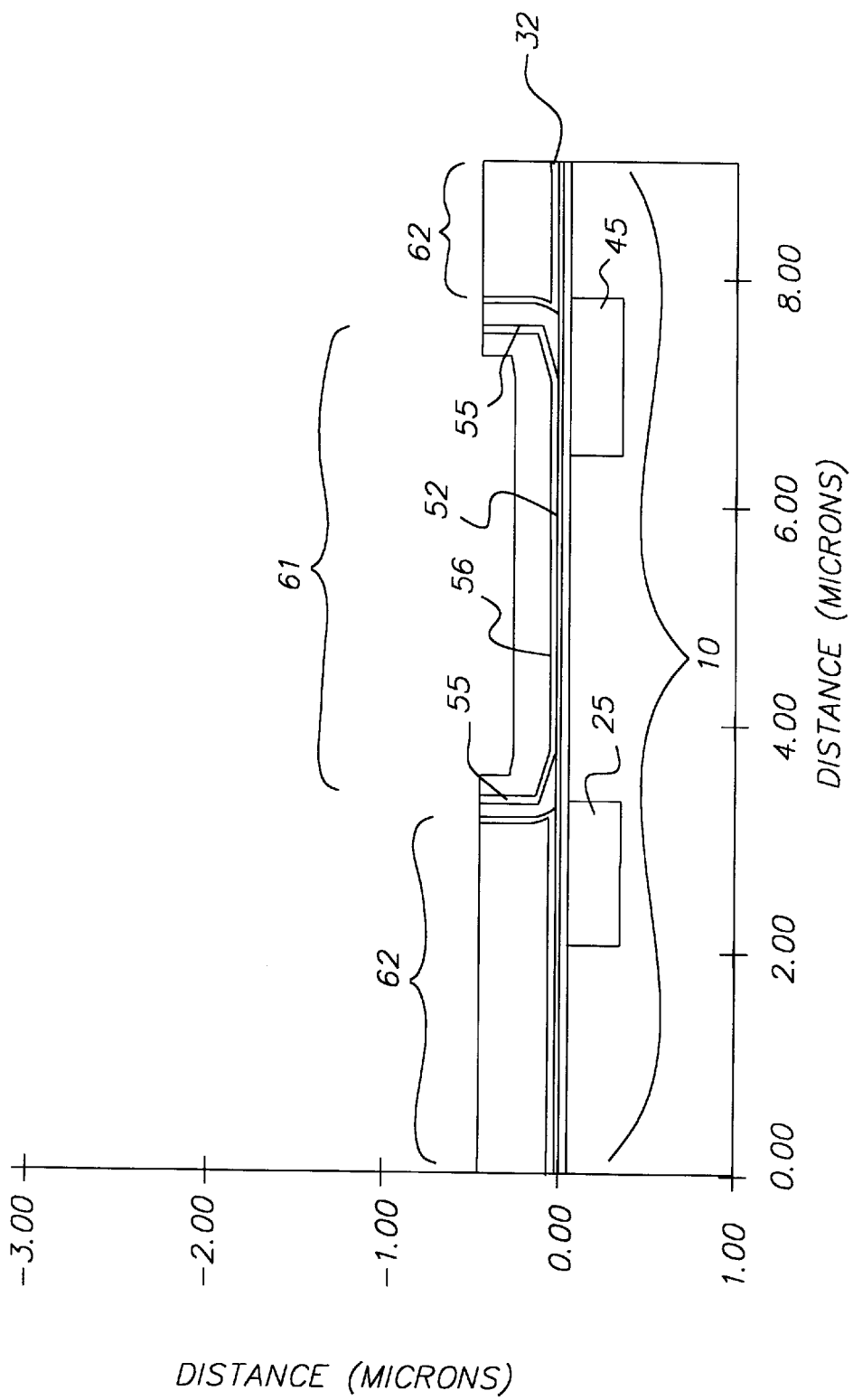

Referring to FIG. 2i, the polish buffer layer 54 is removed via chemical mechanical polishing down through the protrusion 58 so that both layers of gate electrode material 32, 52 form U-shaped gates 61, 62 with now defined first and second phases 1, 2 of CCD 10. This leaves a vertical component layer 55 of gate electrode material 52 on the oxidized side walls 21 in a vertical direction as well as a horizontal component layer 56 to the gate electrode material 52.

The preferred embodiment to the present invention is provided with doped regions and insulating regions in such a way that an array of separated photosensitive sites, or pixels, is defined. Charge transfer channels are provided as a part of this array. An insulating layer, gate dielectric, is provided over the charge transfer channel. This insulating layer may be composed of one or more separate insulating layers; for example, silicon dioxide (oxide) and silicon nitride. Vertical insulating spacers are provided, for example, by the method suggested in FIG. 1a through FIG. 1e in U.S. Pat. No. 5,891,752.

The invention has been described in detail with particular reference to certain preferred embodiments thereof, but it will be understood that variations and modifications can be effected within the spirit and scope of the invention.

Parts List

10 CCD
12 silicon substrate
14 dielectric layer
16 silicon layer
17 open areas within the phases
18 polish stop layer
21 side walls
23 photoresist
25 barrier implants
32 gate electrode material
34 polish buffer layer
35 vertical component layer
36 horizontal component layer
43 photoresist layer
45 barrier implant
52 gate electrode material
54 polish buffer layer
55 vertical component layer
56 horizontal component layer
58 protrusions
61 U-shaped gate
62 U-shaped gate
100a semiconductor substrate
100b semiconductor
101a gap
101b gap
105a gate electrode
105b gate electrode
106a gate electrode
106b gate electrode
107 vertical electrode segment
108 vertical electrode segment
110a gate dielectric
110b dielectric
115a region of increased potential in the substrate
115b potential non-uniformity in the region below the gap
121 horizontal sections
131 vertical edge sections

What is claimed is:

1. A method of forming CCD electrodes within an image sensing device comprising the steps of:

providing a substrate with a gate dielectric layer formed on a surface;

creating a plurality of phases within the CCD by forming a first set of electrodes by forming a deposited silicon layer on the surface of the CCD;

forming a CMP polish stop layer on the deposited silicon layer;

removing the deposited layer from areas where the first set of electrodes is to be formed;

oxidizing the side walls of the remaining deposited silicon layer;

depositing a gate electrode material on the CCD and a polish buffer layer on the gate electrode material;

polishing the device until the gate electrode material is removed from the areas above the polish stop layer and the deposited silicon;

removing the polish stop layer and the unoxidized portion of the deposited silicon layer;

depositing a second layer of gate electrode material on the device and a second polish buffer layer on the second gate electrode material; and polishing the device until there is no second gate electrode material either on top of or in contact with the first gate electrode material.

2. The method of claim 1 wherein the CCD is a two-phase CCD and implants are created prior the steps of depositing the gate electrode material.

3. The method of claim 1 wherein the providing step further comprises the gate dielectric layer to be oxidation resistant.

4. The method of claim 1 wherein the providing step further comprises the gate dielectric layer is a bilayer stack of silicon oxide and silicon nitride.

5. The method of claim 1 wherein the deposited silicon layer is either amorphous or crystalline.

6. The method of claim 1 wherein the step of forming a CMP polish stop layer further comprises forming a silicon nitride layer as the polish stop layer.

7. The method of claim 1 wherein the step of depositing the gate electrode material further comprises depositing a gate electrode material that is essentially transparent.

8. The method of claim 7 wherein the step of depositing the gate electrode material further comprises depositing as the gate electrode material either ITO or polysilicon.

9. The method of claim 1 wherein the step of polishing the device further comprises creating vertical sidewalls that define different phases within the CCD, such that the sidewalls contain the first gate electrode material and the second gate electrode material wherein there is no electrical contact between the first electrode material and the second gate electrode material.

* * * * *